United States Patent [19]

Korhonen et al.

[11] Patent Number: 5,649,320

[45] Date of Patent: Jul. 15, 1997

[54] AUTOMATIC FREQUENCY CONTROL LOOP AND TEMPERATURE COMPENSATION FOR A RECEIVER

[75] Inventors: Veijo Korhonen; Tero Ojanperä, both of Oulu, Finland

[73] Assignee: Nokia Mobile Phones Ltd., Salo, Finland

[21] Appl. No.: 730,182

[22] Filed: Oct. 15, 1996

Related U.S. Application Data

[63] Continuation of Ser. No. 386,212, Feb. 9, 1995, abandoned, which is a continuation of Ser. No. 21,210, Feb. 23, 1993, abandoned.

[30] Foreign Application Priority Data

Mar. 9, 1992 [FI] Finland ................................. 921026

[51] Int. Cl.$^6$ ................................................. H04B 1/26
[52] U.S. Cl. ........................ 455/196.1; 455/260; 455/316; 331/176
[58] Field of Search .................... 455/54.1, 62, 76, 455/161.1, 161.2, 161.3, 164, 165, 183.1, 183.2, 182.2, 182.3, 192.1, 192.3, 196.2, 256, 258, 260, 264, 265, 316; 331/175, 176

[56] References Cited

U.S. PATENT DOCUMENTS

| | | | |
|---|---|---|---|
| 4,374,437 | 2/1983 | Citta et al. ............................ | 455/182.2 |
| 4,594,611 | 6/1986 | Sugibayashi et al. .................. | 358/191 |
| 4,703,520 | 10/1987 | Rozanski, Jr. et al. .................. | 455/75 |
| 4,893,097 | 1/1990 | Zwack .................................... | 331/176 |
| 5,115,515 | 5/1992 | Yamamoto et al. ..................... | 455/265 |
| 5,161,253 | 11/1992 | Hirano ................................ | 455/161.3 |
| 5,204,975 | 4/1993 | Shigemori ............................. | 455/256 |
| 5,220,682 | 6/1993 | Tomohiro ............................ | 455/161.3 |

FOREIGN PATENT DOCUMENTS

| | | | |
|---|---|---|---|
| 0 438 309A2 | 7/1991 | European Pat. Off. ........ | H03L 7/197 |
| 0297624 | 4/1988 | Japan ................................. | 455/161.1 |
| 2 040 622 | 8/1980 | United Kingdom .............. | H03J 7/18 |

OTHER PUBLICATIONS

Patent Abstracts of Japan: vol. 15, No. 161 (E–1060) 23 Apr. 1991 and JP3032205, Dec. 02, 1991.

*Primary Examiner*—Reinhard J. Eisenzopf
*Assistant Examiner*—Thanh Le
*Attorney, Agent, or Firm*—Perman & Green, LLP

[57] ABSTRACT

A receiver and a method of setting the frequency of the reference signal in the receiver, the receiver comprising a voltage controlled crystal oscillator which provides the reference frequency for a synthesizer. The synthesizer in turn produces the local oscillator frequency signal in the receiver. Temperature fluctuations in the crystal are compensated for by microprocessor control of the oscillator. The reference frequency is accurately set by incrementaly scanning the signal channel until a signal of magnitude greater than a predetermined level is detected, whereupon the receiver locks onto said detected signal and instructs the oscillator to produce a reference frequency signal of a certain frequency according to the frequency of said detected signal.

14 Claims, 3 Drawing Sheets

AUTOMATIC FREQUENCY CONTROL LOOP AND TEMPERATURE COMPENSATION FOR A RECEIVER

This is a continuation of Ser. No. 08/386,212, filed Feb. 9, 1995, abandoned, which is a continuation of Ser. No. 08/021,210, filed Feb. 23, 1993 abandoned.

The present invention relates to a method of and apparatus for setting the reference frequency in a receiver.

BACKGROUND OF THE INVENTION

When a phone call is placed from a radio telephone mobile station (MS) to a base station (BS), or when the best calling channel is searched for, in known cellular telephone systems presently in use the mobile station has to search a great number of radio channels according to acceptance criteria defined in the respective system specifications. For example in the NMT-900 system the number of channels to be searched is between 1 and 1999.

The channel search process in a mobile phone is described below using the NMT system as an example. FIG. 1 shows the blocks required for the channel search in an NMT telephone. The received signal is shifted to the intermediate frequency $f_{IF}$ in a mixer and then supplied to the intermediate frequency circuit 1 separating from the carrier the alternating speech signal and the signalling, which is supplied to the data demodulator 3. Here the signalling is converted into a binary signal and supplied to the microprocessor 5 of the telephone. When the data detector 4 discovers that there is signalling on the data line from the intermediate frequency circuit 1 it examines the activating pulse DDC. The intermediate frequency circuit 1 also supplies a d.c. voltage RSSI, which is proportional to the strength of the received high frequency signal. This d.c. voltage is sampled with the analog-to-digital converter 2 each time the converter receives a control pulse ADC. All information between the microprocessor 5 and the functional blocks is transmitted on the data bus. The channel search proceeds according to the timing diagram shown in FIG. 2, in which the operating times are shown as time related pulses. $t_0$ is marked as the moment when the synthesizers receive a command to tune onto a new channel n. In the topmost timing diagram the time $T_0$ shown as a pulse illustrates the time required to supply a new divisor to the synthesizer. This time is less than 1 ms. After the synthesizer settling time T1, about 10–15 ms, a short ADC pulse is supplied to the A/D-converter 2, whereby information about the prevailing strength of the received signal is obtained from the RSSI voltage. If the signal is below a given level, then a jump according to arrow A is made directly to a phase where the synthesizer is programmed to the next channel n+1. If the signal strength is above this given level, it is followed by an examination to see whether signalling is received from the intermediate frequency circuit 1. This is performed when an activating pulse DDC is supplied to the data detector 4. This examination takes the time $T_2$ or about 2 to 3 ms. If no signalling is received, the synthesizer is immediately programmed to the next channel n+1. This jump is illustrated by arrow B. If received signalling is detected, there follows a waiting time $T_3$, 0–10 ms, and then the received signal strength RSSI is again read by supplying the activating pulse to the A/D-converter 2. If the signal is too weak, then the synthesizer receives a command to change to the next channel n+1, jump C, but if the signal is acceptable, then the reception and interpretation of the signalling received from the base station is started. The time T4 allowed for the reception is less than or equal to 277 ms. This channel is kept, if according to the interpretation it is the channel searched for, otherwise the synthesizer is programmed to the next channel n+1.

This process is repeated in sequence for all channels in a given channel band, until an acceptable channel is found. There may be several search cycles before an acceptable channel is found. The channel is accepted on three conditions: first, the received signal must be above a given level. There are three levels: level A (20 dBmyV), level B (10 dBmyV), and level C (–2 dBmyV). First signals above the highest level are looked for, and if there are no such signals, a step to the next level is taken, and so on. Second, signalling must be received from the channel, and third, based on the interpretation of this signalling, the channel must be the channel looked for.

In present mobile phones a voltage controlled temperature compensated crystal oscillator is used as a frequency reference with an accuracy of the order 2 ppm, or at least of the order 10 ppm. For example in the GSM system the transmitter's carrier frequency stability must be below ±100 Hz or 0,1 ppm. Due to this frequency stability requirement the frequency must be controlled by an automatic frequency controller (AFC, Automatic Frequency Control).

In multichannel radio telephones such as in modern mobile phones the mixer frequencies of the receiver and the transmitter, i.e. the first and second local oscillator frequency of the receiver and the first and second shift oscillator frequency of the transmitter, are often formed by synthesizers from the radio telephone's own reference frequency. There may be one or more synthesizers to generate these signals. In a known way the synthesizers comprise a phase locked loop having an output frequency, which is locked to a reference frequency, whereby this reference frequency is another input of the phase comparator in the loop. The reference frequency again is generated by a voltage controlled, temperature compensated crystal oscillator, since without voltage control the frequency of a crystal oscillator manufactured with today's technique is not sufficiently accurate and the frequency stability is not sufficient, whereby the frequencies generated by the synthesizers would differ too much from the allowed, so that the frequency deviation from the carrier would be too large. E.g. the NMT-900 network allows a frequency deviation of ±0,8 ppm from the nominal frequency. Generally different automatic frequency control means (AFC) are used in order to control the frequency of the reference oscillator. The basic idea in the AFC methods is to lock the reference frequency in some way to the received carrier frequency, since the carrier frequency transmitted by a base station in cellular networks is very stable. According to the general principle the own first local oscillator frequency is compared with the received signal frequency, and the frequency of the own oscillator generating the reference frequency is controlled in accordance with the obtained frequency difference.

A modern AFC method is disclosed in the patent FI-79636, Nokia Matkapuhelimet Oy and the corresponding German Patent Application DE 3738124.5. There a constant time is generated with the aid of the frequency of the crystal oscillator connected to the processor, during which time the periods of a signal received and shifted to the second intermediate frequency are counted in a counter. The counting result is in digital form, and then after a D/A-conversion the counting result is used to control the reference oscillator. This mode, as well as many other modes utilizing the carrier frequency, are substantially based on the use of a processor performing the control and the calculations. Therefore the telephone's RF-parts require for the AFC only a buffer for the intermediate frequency signal, an output line for the intermediate frequency signal, and an input control line for the temperature compensated crystal oscillator. The AFC facility itself, or the calculation and the control, is performed by the processor and its peripheral equipment in the audio/logic parts of the telephone. The AFC facility moreover requires information about the received signal strength and a memory, which stores the correct control data or the frequency information for the temperature compensated crystal oscillator. It is necessary to store the frequency information regarding those situations where the signal received from the base station is momentarily lost (the maximum waiting time in the NMT system is about 4 minutes). In the NMT the AFC facility must not offset the output frequency more than 4 kHz from the nominal frequency, regardless of the frequency received from the base station. However, the control must be able to correct a possible error of 2,5 kHz, caused by temperature drift in the crystal oscillator. The advantage of known systems of this kind is that the frequency reference limits can be set by a program, and that the last control voltage value is left in the memory when the received signal fades out. On the other hand these known systems have a disadvantage in that they use the processor capacity by utilizing its program memory capacity. On the other hand this load is periodic. Further they require counters and at least the control lines mentioned above, as well as a plurality of connections between the RF-parts and the logic parts. The LFK patent application No 9203597.1 discloses an invention, with which it is possible to obviate the above mentioned disadvantages and to provide means to realize the whole AFC facility without programming, using only components (in hardware). Thus it is possible to realize all of the AFC facility in the radio frequency parts, whereby it is possible, considering the manufacture, to integrate the AFC facility on the same silicon chips as the other RF-parts, and thus to reduce the space requirements.

Due to the frequency jumps and the monitoring of the neighbour base station service area both the transmitter and the receiver must tune to a new frequency in less than one millisecond. This poses considerable requirements on the setting time of the synthesizer. Temperature variations and e.g. ageing will cause frequency drift. It has been tried to compensate frequency changes due to temperature changes by using an expensive voltage controlled temperature compensated crystal oscillator. On the other hand it is not so easy to compensate for frequency changes caused by ageing. The European patent application no.- 890111143.7 describes an AFC method operating according to the counter principle, with which it is possible to compensate for the frequency drift caused by ageing. Neither is the compensation possible with the method described in the publication, if the frequency provided by the reference oscillator differs largely from the correct value of the reference frequency.

SUMMARY OF THE INVENTION

According to a first aspect of the present invention there is provided a method of setting the reference frequency in a radio receiver in which an oscillator supplies a reference signal to a synthesizer, the synthesizer adjusting the receiver to a frequency channel in response to said reference signal, characterized by the receiver incrementally scanning said channel, determining at each increment whether or not a signal indicative of the received signal strength is greater than a predetermined threshold, and locking on to said signal, adjusting the frequency of said reference signal in accordance with the frequency of said signal, and maintaining the frequency of said reference signal substantially constant.

According to a second aspect of the present invention there is provided a receiver comprising an oscillator coupled to a synthesizer for providing a reference signal to the synthesizer, the synthesizer being coupled to a mixer providing a local oscillator frequency signal to an input of the mixer, another input of the mixer receiving as an input a radio frequency signal received by the receiver, the mixer producing an intermediate frequency output signal which is coupled to detection means which both determine the magnitude of the received signal and determine whether or not an information signal is present in the received signal, the detection means being coupled to a microprocessor, characterized in that the oscillator is a voltage controlled crystal oscillator the output of which is controlled by a digital to analog converter which is controlled by said microprocessor in order to compensate for fluctuation in the crystal temperature, temperature information being provided by a temperature sensor coupled to the microprocessor.

An advantage of the present invention is that the receiver can utilize a non-temperature compensated crystal oscillator, and can accomodate even a quite large temperature variation, e.g. ±20 ppm.

When the radio telephone power is switched on and the radio telephone with the aid of the synthesizer tunes to the channel, the channel is examined in increments of a given size by changing the frequency of the synthesizer's frequency reference. In other words, the channel is covered by small increments, or the channel is scanned. Each increment includes checking whether the required d.c. voltage or RSSI level is received, which is required of the base station signal. If a required RSSI level is not found at the frequency in question, the frequency is changed to the next increment. If the required RSSI level is found, then it is checked whether a modulated data signal (FSK) is received. Thereafter the automatic frequency control facility is switched on and a locking to that signal is made. In this way a correction is obtained for the frequency reference at the prevailing temperature, providing a faster channel search. It is possible to lock onto the signal, even if an FSK signal is not found.

BRIEF DESCRIPTION OF THE DRAWINGS

An embodiment of the invention is described, by way of example, with reference to the accompanying drawings, in which.

DETAILED DESCRIPTION OF THE INVENTION

Figure 1:
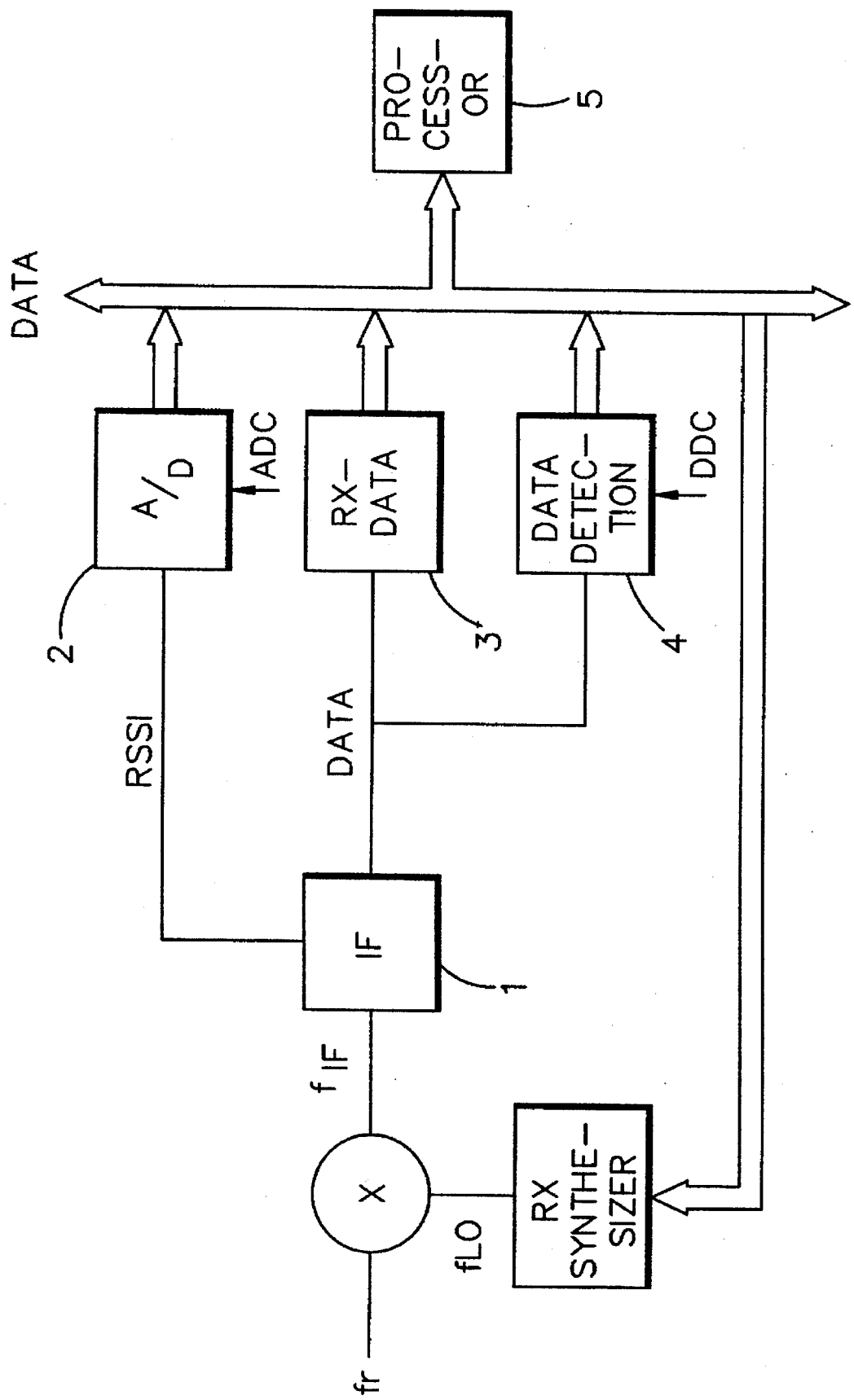
FIG. 1 shows the functional blocks of the receiver used in the channel search, in accordance with the present invention.
Figure 2:
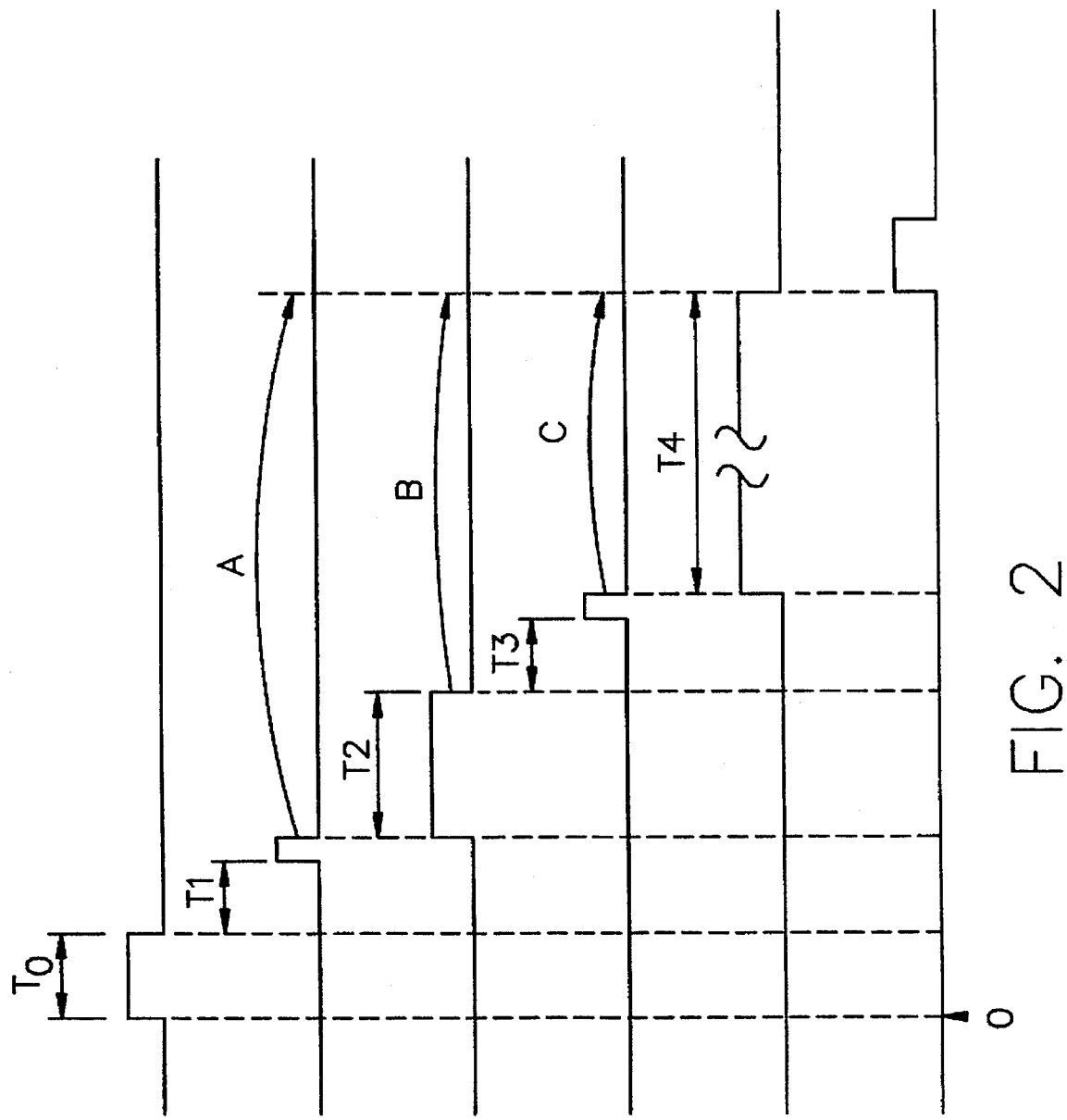
FIG. 2 shows as a timing diagram the channel search process in a known system.

FIGS. 1 and 2 illustrate the channel search in an NMT telephone. They were described in detail above, and reference is made to them, as required.

Figure 3:
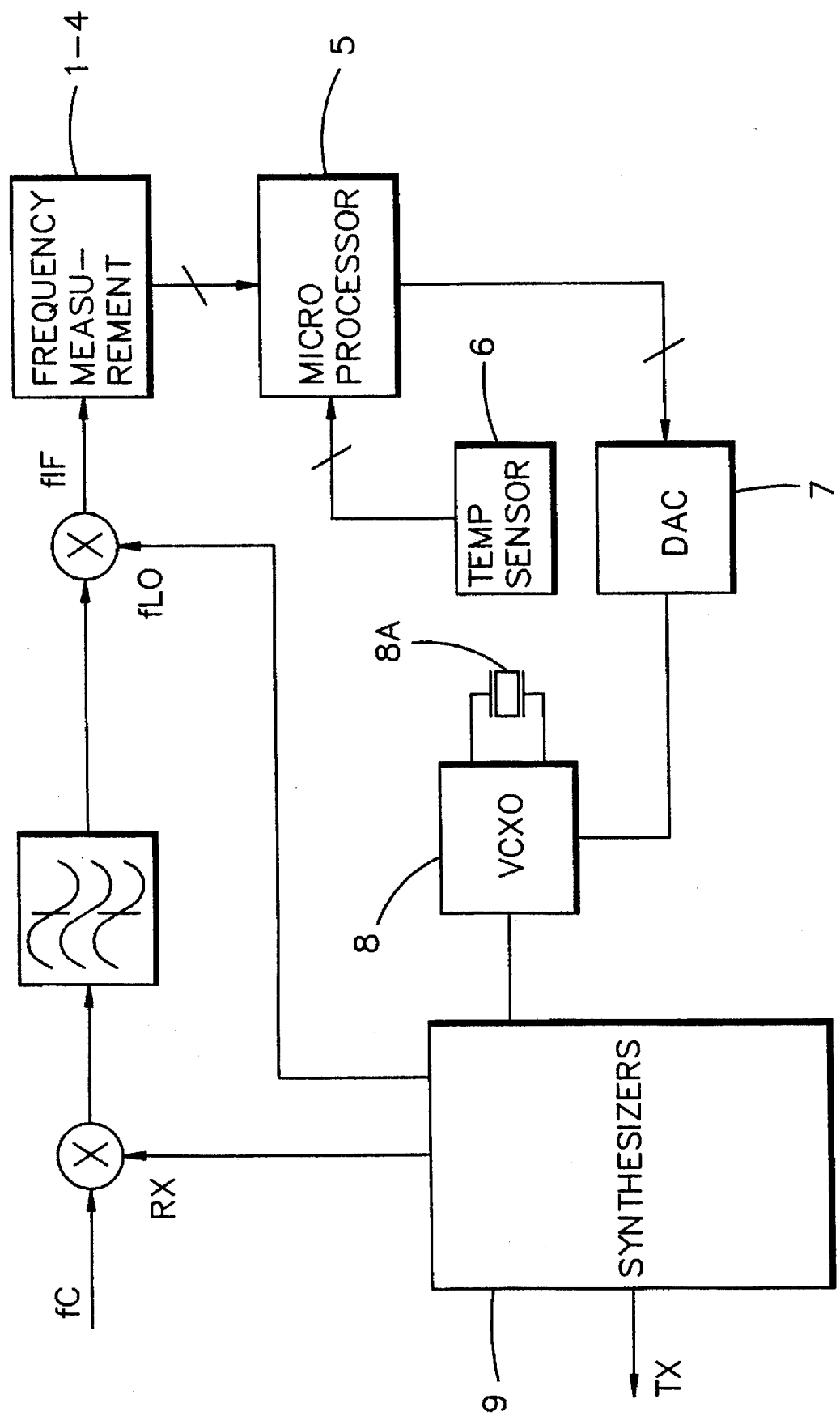
FIG. 3 shows the functional blocks of the receiver used when the frequency of the reference signal is stabilized.

In the method according to the invention the searched channel is scanned in small frequency increments. At each increment a check is made with the A/D-converter 2 (FIG. 1), whether the required voltage or RSSI level is received. If a required RSSI level is not found at the checked frequency, the frequency of the synthesizer is changed to the next increment. Accordingly, if no required RSSI level is found on the whole channel, the next channel is selected. When the required RSSI level is found, the modem 3 checks (in transmission the modulator 3 and in reception the demodulator 3), whether an FSK signal is received from the intermediate frequency circuit. Then the automatic frequency control facility is switched on and the phone is locked to that signal. It is not necessary to receive an FSK signal in order to lock onto the received signal. Thus a correction is obtained for the frequency reference, which the crystal oscillator 8 supplies to the synthesizer 9 (FIG. 3) at the prevailing temperature, which provides for a faster channel search. The temperature of the crystal 8a providing the frequency to the voltage controlled crystal oscillator 8 can be measured during the use of the radio telephone with the temperature sensor 6, e.g. an NTC resistor. The AFC facility's D/A-converter 7 receiving commands from the microprocessor 5 is used to control the reference frequency, which is the output provided by the crystal oscillator 8. The temperature diagram of the crystal 8a is processed by the processor 5 so that a mean frequency value of the crystal is stored in the memory, and with this it is possible to make a coarse compensation, so that the frequency provided by the crystal oscillator 8 already would be close to the correct value. The accuracy of this compensation depends on the tuning made in the production. Based on the temperature of the crystal 8a measured by the temperature sensor 6 and on the frequency of the received signal the processor 5 calculates a correction word used to control via the D/A-converter 7 the reference frequency supplied by the crystal oscillator 8. The processor 5 can update the temperature diagram in the memory in accordance with the temperature measurements and the frequencies of the received signals.

When the radio telephone power is switched on and the channels are scanned, and when the reference frequency is set according to the invention, it is not necessary to scan the channels again in a way according to the invention, but the telephone operates reliably at the prevailing temperature, and the channel search is fast as the reference frequency is set to the correct value very accurately. The accuracy or the frequency stability obtained with the method according to the invention depends on the accuracies of the frequency measurement 1–4 and of the D/A-converter 7. When the phone is locked to a signal, the exact frequency is searched with the automatic frequency controller AFC, in which the control accuracy of the D/A-converter 7 determines the smallest possible frequency increment obtained with the oscillator 8. The smaller the frequency increment, the better frequency stability is obtained. The crystal oscillator 8 controlled by the D/A-converter 7 is used to control the frequency increment. Alternatively the channel scan with small frequency increments can be realized with an interpolating frequency synthesizer, which can generate frequencies between the integer factor frequencies by using the internal logic of the synthesizer for division and multiplication. Then it is not necessary to control the crystal frequency itself. The realization and the function of an interpolating synthesizer is presented in more detail in the European patent application no. 91300361.2.

The method according to the present invention provides a good stability of the reference frequency in a radio telephone and the possibility to use a voltage controlled crystal oscillator, which is more economical and of a smaller size than a voltage controlled temperature compensated crystal oscillator. The method according to the invention can be used in any radio telephone system, such as in NMT, TACS/AMPS, GSM and TIA.

Modifications of the present invention may be incorporated without departing from the scope of the present invention.

We claim:

1. A method of setting a reference frequency signal in a radio receiver in which an oscillator supplies said reference frequency signal to a synthesizer, and the synthesizer adjusts the receiver to a frequency channel in response to said reference frequency signal, comprising the steps of:
    a) incrementally scanning a plurality of frequency increments which span said frequency channel,
    b) determining within each increment whether or not a signal indicative of a strength of a received signal frequency is greater than a predetermined threshold, and when a strength indicative signal is detected to be greater than said predetermined threshold and the corresponding received signal frequency is determined to have modulated data thereon, locking on to said corresponding received signal frequency,
    c) adjusting the frequency of said reference frequency signal in accordance with ambient temperature information and said corresponding received signal frequency, and
    d) maintaining the adjusted frequency of said reference frequency signal substantially constant.

2. A method as claimed in claim 1, wherein said frequency channel is scanned in small frequency increments compared to the bandwidth of said frequency channel by changing the reference frequency signal to the synthesizer.

3. A method as claimed in claim 1, wherein information on the corresponding received signal frequency is supplied to a receiver microprocessor which also receives, from a temperature sensor, information about the ambient temperature of a crystal supplying the reference frequency signal to the oscillator, and based on said frequency and temperature information, the receiver microprocessor supplies a correction signal to a receiver automatic frequency control facility for controlling the reference frequency signal being provided as an output by the oscillator.

4. A method as claimed in claim 3, wherein the receiver microprocessor receives from a memory, information about a mean temperature response of the crystal, according to which, the reference frequency signal of the oscillator is set to an initial value before a scanning action begins.

5. A method as claimed in claim 4, wherein the receiver microprocessor updates mean temperature response data in the memory in accordance with a temperature measurement provided by the temperature sensor and in accordance with the corresponding received signal frequency.

6. A radio receiver comprising:
    a microprocessor;
    an oscillator for providing a reference signal;
    a synthesizer coupled to said oscillator for receiving said reference signal therefrom and providing a local oscillator frequency signal in response thereto;
    a mixer having an input for receiving said local oscillator frequency signal from said synthesizer and another input for receiving a radio frequency signal received by the receiver, said mixer producing an intermediate frequency output signal indicative of said inputs;
    detection means for receiving said intermediate frequency output signal from said mixer and determining therefrom the magnitude of the received radio frequency signal and whether or not an information signal is present in the received radio frequency signal, said detection means being coupled to said microprocessor, and further comprising:
    a digital to analog converter coupled to and controlled by said microprocessor;

a temperature sensor coupled to said microprocessor; and wherein said oscillator is a voltage controlled crystal oscillator having a crystal associated therewith, the output of said oscillator being controlled by said digital to analog converter, said microprocessor providing a signal to said digital to analog converter that is dependent on (i) the frequency of said received radio frequency and, (ii) a temperature information input to compensate for fluctuation in the temperature of said crystal associated with said voltage controlled oscillator, the temperature information input being provided from said temperature sensor coupled to the microprocessor, whereby the frequency of said reference signal is adjusted in accordance with the frequency of said received radio frequency and said temperature information.

7. A receiver as claimed in claim 6, wherein said digital to analog converter comprises an automatic frequency control facility in combination with the microprocessor, for controlling the reference frequency supplied by the voltage controlled crystal oscillator to the synthesizer.

8. Apparatus for setting a reference frequency signal in a radio receiver, comprising:

oscillator means for producing said reference frequency signal;

crystal means for supplying said reference frequency signal to said oscillator means;

synthesizer means, coupled to said oscillator means, for adjusting the receiver to receive a frequency channel in response to said reference frequency signal;

means for incrementally scanning a plurality of frequency increments which span said received frequency channel;

means, responsive to said scanned frequency increments, for determining within each increment whether or not a signal indicative of a strength of a received signal frequency is greater than a predetermined threshold, and when a strength indicative signal is detected to be greater than said predetermined threshold and the corresponding received signal frequency is determined to have modulated data thereon, locking on to said corresponding received signal frequency and producing a signal indicative thereof;

means for sensing the temperature of said crystal means and producing a signal indicative of said temperature;

microprocessor means, coupled to said determining means and said temperature sensing means, for receiving said signal indicative of said locked on received signal frequency and said signal indicative of said sensed temperature and producing an output indicative thereof;

means, responsive to said output from said microprocessor, for adjusting the frequency of said reference frequency signal output by said oscillator means in accordance with said sensed temperature and said locked on received signal frequency.

9. Apparatus as in claim 8, wherein said frequency adjusting means comprises a digital to analog converter.

10. Apparatus as in claim 8, wherein said determining means comprises:

means for sensing the presence of modulated data on a received signal frequency after the corresponding strength indicative signal of said received signal frequency is detected to be greater than said predetermined threshold and before locking onto said received signal frequency; and means, responsive to the failure of said modulated data sensing means to sense the presence of modulated data on said received signal frequency, for activating said incrementally scanning means to scan the next frequency increment in said frequency channel, rather than locking on to said received signal frequency.

11. Apparatus as in claim 8, further comprising:

means for storing data on the temperature response of said crystal means and providing a signal indicative thereof to said microprocessor means; and wherein said microprocessor means comprises:

means, responsive to said temperature response indicative signal, for providing an output signal from said microprocessor means to set the reference frequency signal of said oscillator means to an initial value before said scanning action begins.

12. Apparatus as in claim 11, further comprising:

means, responsive to said microprocessor output signal indicative of sensed temperature and locked on received signal frequency, for updating said mean temperature response data in said storage means in accordance with said sensed temperature and in accordance with said locked on received signal frequency.

13. Apparatus as in claim 8, wherein said scanning means comprises means for scanning said frequency channel in small frequency increments, as compared to the bandwidth of said frequency channel, by changing the reference frequency signal to said synthesizer means.

14. Apparatus as in claim 8, wherein said oscillator means comprises a voltage controlled crystal oscillator.

\* \* \* \* \*